United States Patent [19]

Hajovsky

[11] Patent Number: 4,874,548
[45] Date of Patent: Oct. 17, 1989

[54] CONDUCTIVE ADHESIVE

[75] Inventor: Robert J. Hajovsky, Scotland, Tex.

[73] Assignee: Ameron, Inc., Monterey Park, Calif.

[21] Appl. No.: 167,368

[22] Filed: Mar. 14, 1988

[51] Int. Cl.$^4$ .............................................. H01B 1/06
[52] U.S. Cl. .................................. 252/511; 252/512; 252/518; 523/457; 523/468
[58] Field of Search ............... 252/512, 518, 511, 502; 523/457, 468

[56] References Cited

U.S. PATENT DOCUMENTS

| | | | |
|---|---|---|---|
| 4,115,338 | 9/1978 | Kobayashi et al. | 260/29.4 |
| 4,155,896 | 5/1979 | Rennier et al. | 252/511 |
| 4,314,917 | 2/1982 | Wolfrey | 252/511 |
| 4,519,941 | 5/1985 | Anderson | 252/511 |
| 4,533,685 | 8/1985 | Hudgin et al. | 252/511 |
| 4,544,688 | 10/1985 | Salensky et al. | 252/511 |
| 4,557,860 | 12/1985 | DiSalvo et al. | 252/512 |
| 4,568,592 | 2/1986 | Kawaguchi et al. | 252/512 |
| 4,582,872 | 4/1986 | Hudgin et al. | 250/511 |
| 4,652,398 | 3/1987 | Goswami et al. | 252/514 |
| 4,664,971 | 5/1987 | Soens | 252/512 |

Primary Examiner—Josephine Barr
Attorney, Agent, or Firm—Christie, Parker & Hale

[57] ABSTRACT

An electrically conductive adhesive composition comprises an epoxy resin and stainless steel fibers, or other conductive fibers, having a length of about 4 mm to about 8 mm at a concentration of less 5% by weight. It is preferred that the stainless steel fibers have a length of about 6 mm and a diameter of about 2 μm to about 20 μm, and are present in a concentration of from about 0.7% by weight to about 1.5% by weight. The primary purpose of the adhesive is to continue conductivity across bonds in systems designed to prevent build-up and storage of static electrical charges.

20 Claims, No Drawings

CONDUCTIVE ADHESIVE

FIELD OF THE INVENTION

The present invention relates to a thermosetting adhesive which is electrically conductive due to the provision of conductive fibers within the adhesive.

BACKGROUND OF THE INVENTION

Electrically conductive adhesives are known in the prior art and are exemplified by the compositions disclosed in U.S. Pat. Nos. 4,652,398 and 4,557,860. In these prior art adhesives electrical conductivity is achieved by incorporating a conductive filler, typically silver powder or silver flakes, in the adhesive. These conductive fillers are generally present in an amount of at least 50% by weight of the total adhesive composition.

The use of such high loadings of conductive fillers is required to achieve the necessary degree of conductivity. However, the use of such high concentrations of conductive fillers can result in the loss of adhesive strength with increased temperature, difficulty in mixing and spreading the adhesive, short-working life of mixed components and tendency to sag during cure. In addition, there is tendency for such adhesives to exhibit a loss of conductivity after curing at elevated temperatures. This tendency of prior art adhesives to lose conductivity upon adhesive post-cure is attributed to surface oxidation of the filler.

There therefore exists a need for an electrically conductive adhesive which has high temperature property retention, good-working life, good mixing and application characteristics, and, in addition, is able to withstand high-shear forces and maintain its conductivity after elevated temperature curing.

SUMMARY OF THE INVENTION

The present invention provides an electrically-conductive adhesive which meets the above-described needs. The composition comprises a thermosetting resin, preferably an epoxy resin, and conductive fibers present in the composition at a concentration of less than about 5% by weight, and preferably in the range of about 0.7 to about 1.5% by weight. Preferred fibers are made of stainless steel; however, other conductive fibers such as graphite or metal coated graphite fibers may be used. The conductive fibers each have a length of about four to about eight millimeters, and a narrow diameter, preferably of from about 2 to about 20 microns.

The primary purpose of the adhesive is to continue conductivity across bonds in systems designed to prevent build-up and storage of static electrical charges.

DETAILED DESCRIPTION OF THE INVENTION

In accordance with the present invention there is provided a conductive adhesive comprising a thermosetting resin and conductive fibers. The thermosetting resin may be any suitable thermosetting resin including epoxy polymers, phenolic polymers, polyurethane polymers, polyester polymers, vinyl ester polymers, silicone and silicone epoxy polymers, melamine formaldehyde and melamine phenolic polymers, urea polymers and the like. Epoxies are presently preferred.

In one particularly preferred embodiment of the invention the thermosetting resin is a two-part epoxy resin comprising an epoxy resin blend and an adhesive hardener blend. The epoxy resin blend comprises an epoxy phenol novalac resin and a bisphenol A epoxy resin. An example of an epoxy phenol novalac resin is PY307, a product of CIBA-GEIGY Corporation. An example of the bisphenol A epoxy resin is EPON 826, a product of the Shell Chemical Corporation.

The adhesive hardener blend comprises one or more curing agents such as aminoethylpiperazine, 4,4'-bis(-para-aminocyclohexyl) methane, 1,2-diaminocyclohexane, and dicyandiamide. 4,4'-bis(para-aminocyclohexyl) methane is available from Air Products & Chemicals Inc. under the name Amicure PACM while 1,2-diaminocyclohexane is available from Pacific Anchor Chemical Corporation under the name Ancamine 1770 and from Milliken Chemical Co. under the trade name Millamine 5260.

The adhesive of the present invention includes conductive fibres. These fibers are preferably composed of a material which will not be detrimentally oxidized during the post-cure of the adhesive. The presently preferred fibers are stainless steel fibers.

The conductive fibers have a length of about 4 mm to about 8 mm, preferably about 6 mm, and a narrow diameter, preferably about 2 to about 20 microns. Fibers having a diameter of about 8 microns are particularly preferred. The conductive fibers are included in the adhesive at a concentration of no more than about 5% by weight, preferably in the range of about 0.7% to about 1.5% by weight. When the thermosetting resin used is a two-part epoxy resin, such as described above, it is preferable that the conductive fibers be included in the epoxy resin blend.

It has been found that the use of conductive fibers having a length of about 4 mm to about 8 mm at a concentration of no more than about 5% by weight and particularly from about 0.7% to about 1.5% by weight results in an adhesive with good electrical conductivity and easy mixing and spreading capabilities while not deleteriously affecting the other properties of the adhesive such as bond strength, working life, etc. Adhesive compositions containing conductive fibers in an amount greater than 5% by weight tend to be difficult to mix and spread and therefore are not generally useful in the practice of the invention. Compositions containing less than about 0.7% by weight conductive fibers are not preferred because the adhesives tend to exhibit too little electrical conductivity for many applications. Compositions containing more than about 1.5% by weight and up to about 5% by weight conductive fibers, while useful, are not preferred because no significant advantage by the additional fiber content is typically seen.

Fibers having a length of more than about 8 mm are not preferred because the inclusion of such fibers tends to result in a composition which is difficult to mix and spread. Fibers less than about 4 mm in length are also not preferred because it has been found that too little conductivity is achieved with such fibers unless the concentration of the fibers is increased to above about 5% by weight. However, this results in poor mixing and spreading properties as described above.

In addition to the conductive fibers, the adhesive composition may comprise other fillers or additives as desired. For example, in the preferred epoxy resin described above, the epoxy resin blend preferably also includes fibers such as glass fibers as a reinforcement and thixotropic agent. Suitable glass fibers are obtainable for example from Evanite Glass Fibers Inc. Dyes or coloring agents, e.g. titanium dioxide, may also be included as desired. Likewise the hardener blend may include a toughening agent, e.g. an amine-terminated butadiene/acrylonitrile, such as HYCAR-ATBN 1300X16, a product of B. F. Goodrich Chemicals Division, and preferably includes a thickening agent such as a hydrophobic formed silica, e.g. Cab-O-Sil TS720, a product of Cabot Corporation. The hardener blend preferably also comprises a small amount of epoxy novalac resin reacted with diamines in the compounding process as an additional thickener and to increase the temperature and corrosion resistance of the product. Silicon dioxide sand or the like is preferably added to the hardener blend to enhance gap filling properties of the adhesive and to prevent pipe bond slippage before the adhesive cures. A coloring agent e.g. a dye may also be added.

Generally use of conductive fibers as described, 4 mm to 8 mm in length at 0.7% to 5% by weight to achieve adequate conductivity for static electricity dispersion, allows formulation of the thermoset adhesive to specific performance and handling requirements. These requirements are not significantly altered by the conductive filler.

Compositions of the present invention exhibit good electrical conductivity, high temperature property retention, good working life, good gap filling capability and easy mixing and spreading. The compositions are particularly suitable for use in joining conductive fiberglass pipe or the like e.g., fiberglass pipe wound with conductive carbon fibers, which disperse static electrical charges generated, for example, by the fluids running through the pipe.

EXAMPLE 1

An electrically conductive adhesive composition according to the present invention was produced having the following composition:

| Epoxy Resin Blend |
| --- |
| Araldite PY307 - 85 parts by weight |
| EPON 826 - 35 parts by weight |
| Evanite 517CX - 4 parts by weight |
| Cab-O-Sil TS720 - 4 parts by weight |
| Titanium dioxide pigment - 1 part by weight |
| BEKI SHIELD GR90/C2/6 - 1.5 parts by weight (6 mm length), or |
| BEKI SHIELD GR90/C2/4 - 2.5 parts by weight (4 mm length) |

Araldite PY307 is an epoxy phenol novalac resin with a viscosity of 400 poises at 25° C. It is a product of CIBA-GEIGY Corporation.

EPON 826, a product of the Shell Chemical Company, is a Bisphenol A epoxy resin with a viscosity of about 50 to 65 poises at 25° C. It is used in the resin blend as a reactive viscosity reducer for Araldite PY307.

Evanite 517CX is a product of Evanite Glass Fibers Inc. of Corvallis, Oreg. consisting of short staple glass fibers. It is used in the resin blend as a reinforcement and thixotropic agent.

Cab-O-Sil TS720 is a hydrophobic fumed silica from Cabot Corporation and is used as a thickening and thixotropic agent.

Titanium dioxide pigment is used in the resin blend as a coloring agent.

BEKI SHIELD GR90/C02/6 are stainless steel fibers available from Bekaert Steel Wire Corporation, Atlanta, Ga. The fibers have a diameter of about 8 μm and are 6 mm in length. Alternate material, BEKI SHIELD GR90/C2/4, are stainless steel fiber 4 mm in length.

| Adhesive Hardener Blend |
| --- |
| Aminoethylpiperazine - 30 parts by weight |
| Amicure PACM - 30 parts by weight |
| Ancamine 1770 - 40 parts by weight |
| Dicyandiamide - 2 parts by weight |
| DEN438 or EPN1138 - 25 parts by weight |

Aminoethylpiperazine is a product of Union Carbide Corporations. It is used in the hardener blend as a diamine curing agent that accelerates the adhesive gel at lower temperatures and gives high heat distortion temperature with elevated temperature post cure.

Amicure PACM, is a 4,4'-bis(para-aminocyclohexyl) methane obtainable from Air Products and Chemicals Inc. It is used in the hardener blend because of its epoxy curative properties of high heat distortion temperature, good physical properties, and good chemical resistance.

Ancamine 1770 is a 1,2-diaminocyclohexane, which is a product of Pacific Anchor Chemical Corporation. It is also available from Milliken Chemical Co. under the trade name Millamine 5260. It is used in the hardener blend because of its epoxy curative properties of very high heat distortion and good chemical resistance. Also, it is used as a solvent for the dicyandiamide.

Dicyandiamide is a product of American Cyanamid Company, and is used in the hardener blend as a cure accelerator.

DEN 438, a product of Dow Chemical Corp., or EPN 1138, a product of CIBA-GEIGY Corp., are epoxy phenol novalac resins with an average epoxy functionality of 3.6. The epoxy novolac is reacted with the diamines PACM and Ancamine 1770 in the hardener compounding process. This adducting process thickens the hardener blends and adds additional heat and corrosion resistance, typical of novolac epoxies, to the adhesive.

To 100 parts by weight of the above hardener blend was added 5 parts by weight of Cab-O-Sil T5720 and 200 parts Crystal 50 Sand. Crystal 50 Sand is silicon dioxide sand with 80% Sieve No. 40 through 70, and is used in the adhesive hardener blend to enhance the gapfilling properties of the adhesive and to prevent pipe bond slippage before the adhesive cures.

The epoxy resin blend was then mixed with the hardener blend in a ratio of 100 parts to 75 parts by weight.

The resulting adhesive demonstrated the following physical properties set forth in Table 1 below:

TABLE 1

| | | |
| --- | --- | --- |
| Usable Life at 80° F. | 20 min. | |
| DSC Glass Transition Temperature | 127° C. (261° F.) | |
| Aluminum Lap Shear Values: | At 75° F. | 1600 psi |
| | At 150° F. | 1750 psi |
| | At 200° F. | 1875 psi |
| | At 250° F. | 1600 psi |
| Electrical resistance across 0.020" bond aluminum to aluminum, cured 1 hour at 250° F. | less than 100 ohms | |

Aluminum lap shear values were determined using two 2024 T3 nonclad aluminum strips, each measuring 1 inch by 3 inches and having a thickness of 0.063 inch. The strips were bonded together by the adhesive with a one-inch overlap. The thickness of the adhesive was 0.020 inch. The adhesive was cured for one hour at 250° F. The force required to pull the strips apart was then measured using a MTS Material Test System at a crosshead speed of 0.05 inches per minute.

The electrical resistance values shown were determined by measuring the electrical resistance across the aluminum strips described above after bonded together by 0.020 inch adhesive which was cured at 250° F. for one hour.

The preceding description has been presented with reference to preferred embodiments of the invention. Workers skilled in the art and technology to which this invention pertains will appreciate that many alterations and changes in the described composition structures can be practiced without meaningfully departing from the principles, spirit and scope of this invention. Accordingly, the foregoing description should not be read as pertaining only to the precise compositions described, but rather should be read consistent with and as support for the following claims which are to have their fullest fair scope.

What is claimed is:

1. An electrically conductive adhesive composition comprising a curable thermosetting resin and conductive fibers in a concentration of from about 0.7 to less than about five percent by weight of the composition, the conductive fibers each having a length of from about 4 to about 8 millimeters.

2. A composition as claimed in claim 1 in which the concentration of conductive fibers is from about 0.7 to about 1.5% by weight.

3. A composition as claimed in claim 1 in which the fibers are about 6 mm in length.

4. A composition as claimed in claim 1 wherein the conductive fibers are stainless steel fibers.

5. A composition as claimed in claim 4 in which the stainless steel fibers have a diameter of from about 2 $\mu$m to about 20 $\mu$m.

6. A composition as claimed in claim 4 in which the diameter of the fibers is about 8 $\mu$m.

7. A composition as claimed in claim 1 in which the curable thermosetting resin is a curable epoxy resin.

8. A composition as claimed in claim 7 in which the curable epoxy resin comprises an epoxy resin blend and an adhesive hardener blend.

9. An electrically conductive adhesive composition comprising a curable epoxy resin and stainless steel fibers, said stainless steel fibers having a length of from about 4 mm to about 8 mm and being present in a concentration of from about 0.7 to not more than about 5% by weight of the composition.

10. A composition as claimed in claim 9 in which the concentration of conductive fibers is from about 0.7 to about 1.5% by weight.

11. A composition as claimed in claim 9 in which the fibers are about 6 mm in length.

12. A composition as claimed in claim 9 in which the stainless steel fibers have a diameter of from about 2 $\mu$m to about 20 $\mu$m.

13. A composition as claimed in claim 9 in which the curable epoxy resin comprises an epoxy resin blend and an adhesive hardener blend.

14. A composition as claimed in claim 13 in which the weight ratio of the epoxy resin blend to the adhesive hardener blend is about 100 to about 75.

15. A composition as claimed in claim 13 in which the epoxy resin blend further comprises at least one filler selected from the group of thixotropic agents, thickening agents and coloring agents.

16. A composition as claimed in claim 13 in which the conductive fibers are present in the epoxy resin blend.

17. A composition as claimed in claim 13 in which the epoxy resin blend comprises an epoxy phenol novalac resin and a bisphenol A epoxy resin.

18. A composition as claimed in claim 13 in which the adhesive hardener blend comprises at least one curing agent selected from the group consisting of aminoethylpiperazine, 4,4'-bis (para-aminocyclohexyl) methane, 1,2-diaminocyclohexane, dicyandiamide and mixtures thereof.

19. A composition as claimed in claim 13 in which the adhesive hardener blend further comprises at least one filler selected from the group consisting of toughening agents, thickening agents, coloring agents and gap filling agents.

20. A composition as claimed in claim 13 wherein:
the epoxy resin blend comprises about 85 parts by weight epoxy phenol novalac resin, about 35 parts by weight bisphenol A epoxy resin, about 4 parts by weight glass fibers, about 3 parts by weight fumed silica, about 1 part by weight titanium dioxide pigment, and about 1.5 to about 2.5 parts by weight stainless steel fibers; and
the adhesive hardener blend comprises about 30 parts by weight aminoethylpiperazine, about 30 parts by weight 4,4'-bis(para-aminocyclohexyl)methane, about 40 parts by weight 1,2-diaminocyclohexane, about 25 parts by weight epoxy novalac resin, about 2 parts by weight dicyandiamide, about 6 parts by weight fumed silica, and about 250 parts by weight silicon dioxide sand.

* * * * *